United States Patent [19]
Zucker

[11] Patent Number: 5,228,063
[45] Date of Patent: Jul. 13, 1993

[54] CIRCUIT ARRANGEMENT FOR AUTOMATIC GAIN CONTROL

[75] Inventor: Friedhlem Zucker, Mönchweiler, Fed. Rep. of Germany

[73] Assignee: Deutsche Thomson-Brandt GmbH, Fed. Rep. of Germany

[21] Appl. No.: 840,054

[22] Filed: Feb. 21, 1992

[30] Foreign Application Priority Data

Aug. 9, 1989 [DE] Fed. Rep. of Germany ....... 3926272
Jul. 11, 1990 [EP] European Pat. Off. ............ 90/01127

[51] Int. Cl.⁵ ............................................. H04L 27/08
[52] U.S. Cl. .................................. 375/98; 455/234.1; 369/49
[58] Field of Search ................. 375/98, 22; 455/232.1, 455/234.1; 330/127, 128, 129; 329/350; 360/44, 29

[56] References Cited

U.S. PATENT DOCUMENTS 4,789,995 12/1988 Hurst et al. ......................... 375/98 X
5,084,791 1/1992 Thanos et al. ................. 360/77.03 X

FOREIGN PATENT DOCUMENTS 0237682 9/1987 European Pat. Off. .

Primary Examiner—Curtis Kuntz
Assistant Examiner—Tesfaldet Bocure
Attorney, Agent, or Firm—Joseph S. Tripoli; Dennis H. Irlbeck; Lester L. Hallacher

[57] ABSTRACT

An automatic gain control circuit includes an amplifier, the gain of which is to be controlled, and an input terminal for receiving an analog input signal. A first signal path is arranged between the input terminal and the amplifier and includes a controllable switch and a first filter. A second signal path is responsive to the input terminal and includes an analog-to-digital converter for providing digital signals representative of levels of the analog input signal. A signal processor receives the digital signals and provides control signals. A pulse width modulator receives the control signals and provides a pulse width modulated signal, the width of which varies in accordance with the digital signals, to the controllable switch.

4 Claims, 3 Drawing Sheets

CIRCUIT ARRANGEMENT FOR AUTOMATIC GAIN CONTROL

This is a continuation of PCT application PCT/EP 90/01127 filed Jul. 11, 1990 by Friedhelm Zucker and titled "Circuit Arrangement For Automatic Gain Control".

BACKGROUND OF THE INVENTION

The invention is directed to a circuit arrangement for automatic gain control AGC. Automatic gain control is used in many types of equipment, for example in radio receivers or CD players to regulate the maximum output level at a constant level independently of fluctuations in the receiver field strength. In a CD player, or a magneto-optical recording and playback device, a laser beam illuminates an optical recording medium which reflects the laser beam to a photodetector having a plurality of photodiodes. In addition to a data signal, a focusing error signal used in focusing a regulation circuit, and a tracking error signal used in a tracking regulation circuit, are generated from the output signals of the photodiodes. Changes in the laser performance, or in the reflectance capability of the optical recording medium result in changes in the loop amplification of the focus and the tracking regulation circuits.

In an optical reproduction device, described in U.S. Pat. No. 4,835,755, the analog focusing error signal, the analog tracking error signal and the analog speed regulation signal which regulates the r.p.m. of a disk drive motor, are converted to digital signals by several analog-to-digital converters. The digital signals are evaluated in a microprocessor. The microprocessor provides digital regulating signals, which are reconverted to analog signals. The analog regulating signals regulate the actuators of the focus and tracking regulation circuits and the rpm of the disk drive motor.

A further loop amplification circuit is shown in a brochure from Analog Devices which describes an IC component AD 533. This IC device includes an analog divider circuit in which the focusing error signal and the tracking error signal are divided by a value proportional to the total light energy arriving on the photodetector. The focusing error signal and the tracking error signal are, therefore, standardized with respect to the total incoming light energy. However, this solution has two significant disadvantages, the analog divider circuit is relatively expensive and a substantial amount of equalization is required. The invention provides an automatic gain control circuit which is easily manufactured and which requires no equalization.

SUMMARY OF THE INVENTION

With the invention the input signal to be amplified is applied to an amplifier along a first path including a controllable switch and a first low-pass. The signal is also coupled to a second path including a second low-pass filter, an analog-to-digital converter and a microprocessor. The microprocessor controls a pulse-width modulator which controls the controllable switch. The microprocessor provides a control signal to the pulse-width modulator as a function of the digital values received from the analog-to-digital converter.

DETAILED DESCRIPTION

Figure 1:
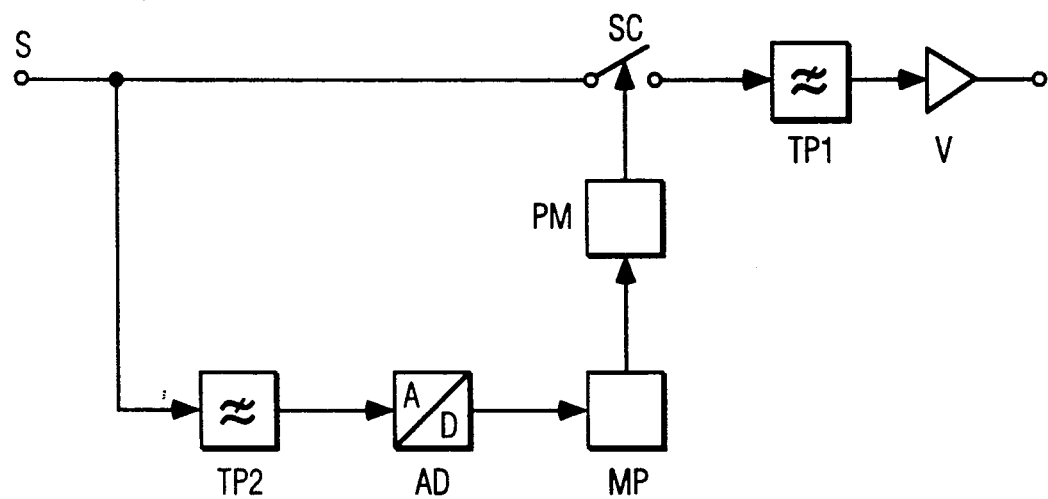
FIG. 1 is a preferred embodiment of the invention.

In FIG. 1, a signal S to be amplified by an amplifier V is applied to the input terminal of a controllable switch SC, the output of which is coupled by a low-pass filter TP1 to the input terminal of an amplifier V. The signal S is also applied to the input terminal of a second low-pass filter TP2, the output terminal of which is coupled to the input terminal of an analog-to-digital converter AD. The output terminal of the analog-to-digital converter AD is coupled to the input terminal of a microprocessor MP. The output terminal of the microprocessor MP is coupled to the input terminal of a pulse-width modulator PM. The output signal of the pulse-width modulator PM is applied to the control input terminal of the controllable switch SC.

In accordance with the digital value received from the analog-to-digital converter AD, the microprocessor MP provides a control signal to the pulse-width modulator PM to adjust the pulse-width repetition rate of the pulse-width modulator output signal. In order to regulate the output level of the amplifier V, the duty cycle at which the switch SC is opened an closed is controlled in accordance with the amplitude of the input signal S. That is, the open/closure ratio of the switch SC is smaller and larger for the amplitude of the input signal S being smaller and larger respectively. However, to prevent rapid changes in input signal S level from being compensated, which would lead to a constant output level from amplifier V independently of the level of the input signal S, a low-pass TP2 is arranged at the input terminal of the analog-to-digital converter AD. Another low-pass TP1 is provided between the controllable switch SC and the amplifier V to suppress the switching frequency and the sidebands of the controllable switch SC. The controllable switch SC, for which a quick analog circuit is particularly well suited, and the low-pass TP1 operate much like an electronically controlled potentiometer. It is particularly advantageous to use a very high switching frequency at the output of the pulse-width modulator.

The microprocessor MP can generate the control signal for the pulse-width modulator PM from a table of values stored in a memory. Each digital value from the analog-to-digital converter AD is allocated a value in the memory. The individual values can determine, for example, the pulse-width duty cycle for the signal from the pulse-width modulator PM. That is, each digital value at the output of the analog-to-digital converter AD establishes a particular pulse-width repetition rate.

Figure 2:
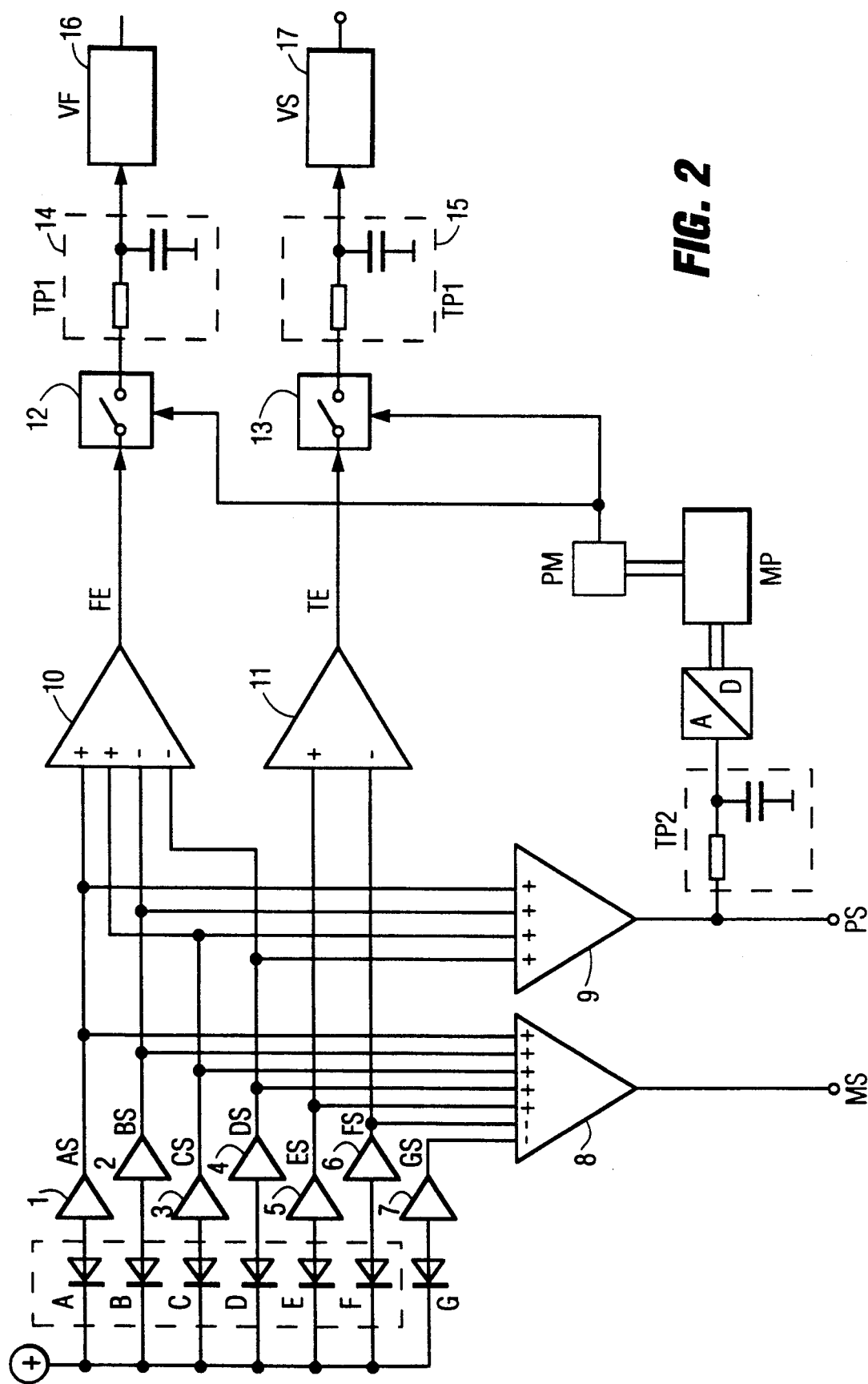
FIG. 2 shows one application of the preferred embodiment of FIG. 1.

The automatic gain control according to the invention is suitable for such uses as the tracking and focus regulation circuit of a CD player or a magneto-optical recording and playback device. Such an application is illustrated in FIG. 2. The magneto-optical recording and playback device can simultaneously read data from a recording medium which is recorded in pits and also in a magneto-optical layer on the recording medium. The optical scanning facility for such a magneto-optical recording and playback device is described in DE-OS 37 32 874; the associated recording medium, on which data is stored by means of pits and also in a magneto-optical layer, is described in DE-OS 37 32 875. The light emitted by a laser is reflected from the magneto-optical recording medium and in a known manner onto a photodetector which has four photodiodes A, B, C and D, and photodiodes E and F adjacent to the four-element photodetector. Also, the recording medium reflects the light emitted by the laser onto an additional photodiode G. The output currents from photodiodes A through G are converted into voltages AS through GS by current-to-voltage converters 1 through 7. An adder and subtracter 8 provides a data signal MS=AS+BS+CS+DS+ES-FS-GS, which contains the data stored in the magneto-optical layer of the recording medium. A data signal PS=AS+BS+CS+DS, which contains the data stored in the pits, is provided by an adder 9. A focusing error signal FE=AS+CS-BS-DS is provided by an adder and subtracter 10. A differential amplifier 11 generates a tracking error signal TE=ES-FS. The output terminal of the adder and subtracter 10 is coupled by a controllable switch 12 and a low-pass 14, constructed as an RC module, to the gain regulation amplifier 16 of the focus regulation loop. The output terminal of the differential amplifier 11 is coupled by a controllable switch 13 and a low-pass 15, also constructed as an RC module, to the gain control amplifier 17 of the tracking regulation loop. The output terminal of the adder 9 is coupled by a low-pass TP2, to the input terminal of an analog-to-digital converter AD, the output terminal of which is coupled with the input terminal of the microprocessor MP. The output terminal of the microprocessor MP is coupled with the input terminal of a pulse-width modulator PM, the output terminal of which is coupled with the control input terminals of the controllable switches 12 and 13.

Figure 3:
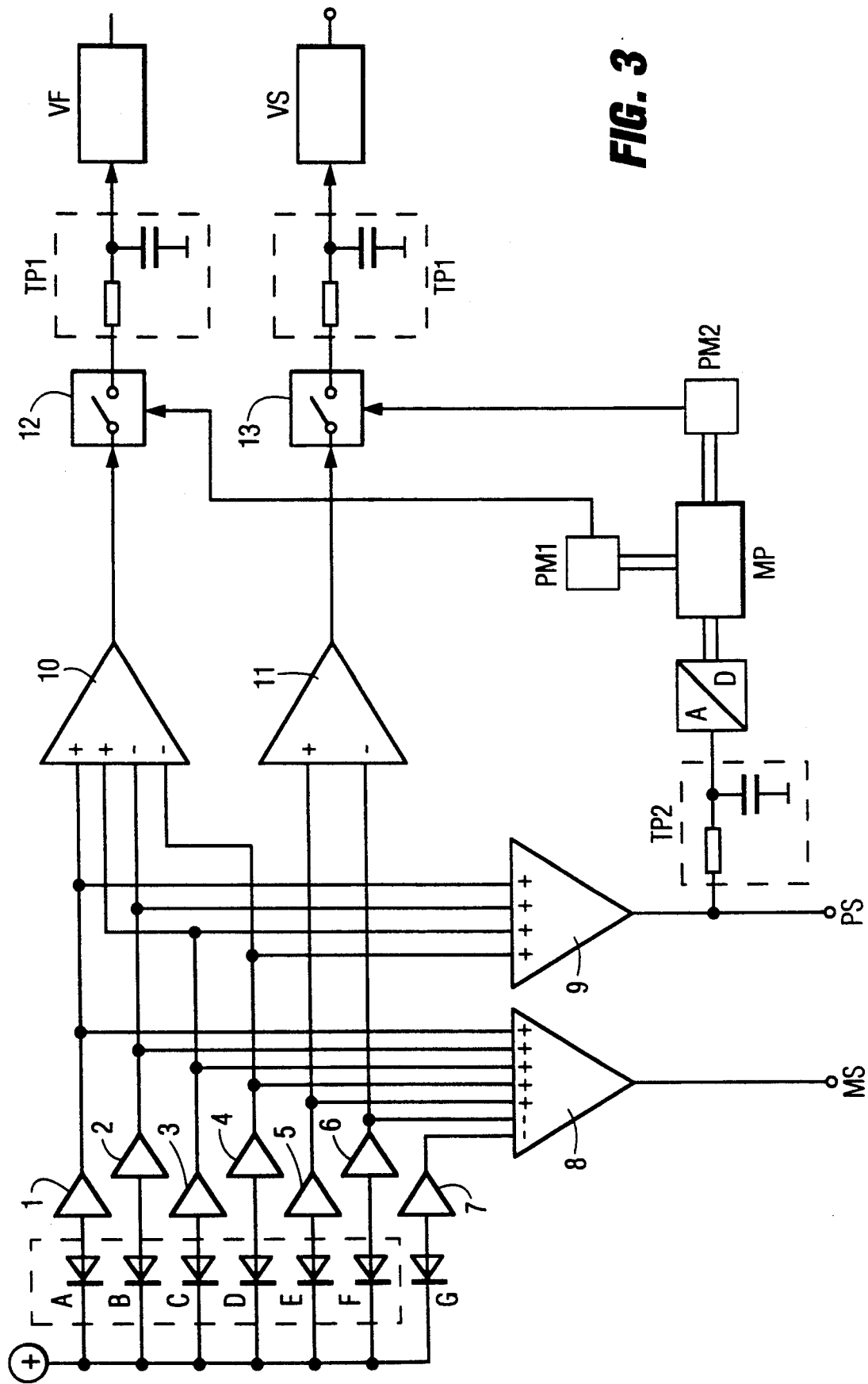
FIG. 3 shows another application of the preferred embodiment of FIG. 1.

As shown in FIG. 3, it is also possible to provide pulse-width modulators PM1 and PM2 for both the focus regulation and the tracking regulation loops. The microprocessor MP then generates a first control signal for the pulse-width modulator PM1, the output terminal of which is coupled with the control input terminal of the controllable switch 12. Also, independently of the first control signal, a second control signal is generated for the other pulse-width modulator PM2, the output terminal of which is coupled to the control input terminal of the controllable switch 13.

The data signal PS=AS+BS+CS+DS represents a direct measurement of the total light energy radiating onto the four-element detector and therefore it is advisable to generate the amplifier regulating signal in the microprocessor MP using the summation signal PS.

The invention is not limited to the applications illustrated in FIGS. 2 and 3 and is suitable for many automatic gain control applications.

I claim:

1. An automatic gain control circuit comprising:
an input terminal for receiving an analog input signal;
a first signal path arranged between said input terminal and an output terminal, said first path including a controllable switch followed by a first low-pass filter;
means responsive to an amplitude value of said input signal for generating control signals; and
pulse width modulator means responsive to said control signals for conditioning said controllable switch to exhibit an open/close ratio which is larger for control signals representing larger said amplitude values than for smaller said amplitude values.

2. The automatic gain control circuit set forth in claim 1 wherein said means for generating control signals includes a second low-pass filter.

3. The automatic gain control circuit set forth in claim 2 wherein said means for generating control signals further includes an analog-to-digital convertor coupled in cascade with said second low-pass filter.

4. The automatic gain control circuit set forth in claim 3 wherein said means for generating control signals further includes a microprocessor coupled to the cascade connection of said analog-to-digital convertor and said second low-pass filter, said microprocessor being programmed to provide predetermined values for respective signal amplitude values provided by said cascade connection.

* * * * *